United States Patent
Yamamoto

(10) Patent No.: US 10,945,361 B2
(45) Date of Patent: Mar. 9, 2021

(54) PRODUCTION LINE SAFETY SYSTEM

(71) Applicant: FUJI CORPORATION, Chiryu (JP)

(72) Inventor: Mizuho Yamamoto, Okazaki (JP)

(73) Assignee: FUJI CORPORATION, Chiryu (JP)

(*) Notice: Subject to any disclaimer, the term of this patent is extended or adjusted under 35 U.S.C. 154(b) by 264 days.

(21) Appl. No.: 16/075,697

(22) PCT Filed: Feb. 17, 2016

(86) PCT No.: PCT/JP2016/054511
§ 371 (c)(1),
(2) Date: Aug. 6, 2018

(87) PCT Pub. No.: WO2017/141365
PCT Pub. Date: Aug. 24, 2017

(65) Prior Publication Data
US 2019/0045682 A1    Feb. 7, 2019

(51) Int. Cl.
H05K 13/08     (2006.01)
H05K 13/02     (2006.01)
(Continued)

(52) U.S. Cl.
CPC ......... H05K 13/083 (2018.08); H05K 13/021 (2013.01); H05K 13/0417 (2013.01);
(Continued)

(58) Field of Classification Search
CPC .. H05K 13/021; H05K 13/0417; H05K 13/08; H05K 13/083; H05K 13/084;
(Continued)

(56) References Cited

U.S. PATENT DOCUMENTS 6,697,681 B1 * 2/2004 Stoddard ............... B25J 9/1656
                                                        700/17
6,877,220 B1 * 4/2005 Kuribayashi ...... H05K 13/0417
                                                        29/832
(Continued)

FOREIGN PATENT DOCUMENTS

EP       2 874 480 A1        5/2015
JP       2013030641 A    *   2/2013
JP       5963863 B2          8/2016

OTHER PUBLICATIONS

International Search Report dated Mar. 15, 2016 in PCT/JP2016/054511 filed Feb. 17, 2016.

*Primary Examiner* — Carl J Arbes
(74) *Attorney, Agent, or Firm* — Oblon, McClelland, Maier & Neustadt, L.L.P.

(57) ABSTRACT

In a component-mounted-board production line in which an automatic exchanging device moves along a row of multiple component mounters, each component mounter is provided with a power supplying section that supplies power wirelessly. The automatic exchanging device is provided with a power receiving section that receives electric power supplied wirelessly from the power supplying section of the component mounter that the automatic exchanging device is facing, a monitoring section that monitors whether a person or object has entered a monitoring area around the automatic exchanging device, and a safety circuit section that turns off the power supply to a motor that is the driving source of the automatic exchanging device but continues supplying power to the monitoring section and the like when the monitoring section detects that a person or object has entered the monitoring area.

5 Claims, 7 Drawing Sheets

(51) Int. Cl.
*H05K 13/04* (2006.01)
*B23P 21/00* (2006.01)

(52) U.S. Cl.
CPC ........... *H05K 13/08* (2013.01); *H05K 13/084* (2018.08); *H05K 13/0885* (2018.08); *H05K 13/0888* (2018.08); *B23P 21/004* (2013.01); *H05K 13/086* (2018.08)

(58) Field of Classification Search
CPC ............. H05K 13/086; H05K 13/0885; H05K 13/0888; B23P 21/004
See application file for complete search history.

(56) References Cited

U.S. PATENT DOCUMENTS

| | | | |
|---|---|---|---|
| 8,046,104 B2* | 10/2011 | Sjoberg | B25J 9/1674 |
| | | | 318/569 |
| 2005/0052148 A1* | 3/2005 | Carlson | F16P 3/141 |
| | | | 318/568.11 |
| 2005/0137746 A1* | 6/2005 | Carlson | G05B 19/427 |
| | | | 700/245 |

* cited by examiner

PRODUCTION LINE SAFETY SYSTEM

TECHNICAL FIELD

The present application relates to a safety system for a production line in which a work device moves along a row of multiple production devices.

BACKGROUND ART

Among component-mounted-board production lines for producing component-mounted-boards by mounting components on a circuit board, for example, as disclosed in patent literature 1(WO2014/010083), there are lines in which a component-mounted-board production line is configured from multiple component mounters arranged in a row along a conveyance path of a circuit board, with an automatic exchanging device (exchange robot) movably arranged on a movement lane provided on a front surface of the multiple component mounters, the automatic exchanging device being moved in front of a specified component mounter based on a production job (production program) or the like, so as to perform setting and removing of a feeder to and from a feeder setting section of the component mounter. With such a production line, power is supplied to the automatic exchanging unit from the component mounter side via wireless power supply (contactless electric power transmission).

CITATION LIST

Patent Literature

Patent literature 1: WO2014/010083

BRIEF SUMMARY

Technical Problem

In order to perform setting and removal of feeders to and from the feeder setting section of each component mounter while the component-mounted-board production line is operating, the automatic exchanging device moves along the movement lane on the front surface of the multiple component mounters, thus, if an operator or object enters the movement area of the automatic exchanging device, the operator or the object may collide with the automatic exchanging device. Generally, emergency stop buttons are provided on component-mounted-board production lines, and if an operator senses danger, they push the emergency stop button to send an emergency stop signal (that is, to stop sending a safe signal) to the automatic exchanging device from the component-mounted-board production line side such that an emergency stop is instigated at the automatic exchanging device.

In this case, because communication between the automatic exchanging device and the component mounter performing wireless power supply is performed wirelessly, the sending of the safe signal to the automatic exchanging device from the component-mounted-board production line side is also performed wirelessly. Generally, while the component-mounted-board production line is operating, a safe signal is sent periodically from the component-mounted-board production line side to the automatic exchanging device, and the automatic exchanging device moves while confirming safety by receiving the safe signal; when an operator pushes the emergency stop button, the sending of the safe signal to the automatic exchanging device is stopped, and the automatic exchanging device performs an emergency stop. With such a system, to prevent a situation in which an "emergency stop" is incorrectly determined immediately if the automatic exchanging device cannot receive the safe signal temporarily due to a temporary power outage or noise or the like, there are items configured to determine an "emergency stop" when a safe signal cannot be received for a specified continuous quantity of times.

However, with such a configuration, because an "emergency stop" is not determined until the safe signal has stopped being received for the specified continuous quantity of times, when a real danger situation occurs, a slight delay occurs before an "emergency stop" is determined, meaning that the emergency stop of the automatic exchanging device is performed with a slight delay. Also, it is necessary to apply for permission to use wireless communication in each different country, and it takes time and money to gain such permissions.

The above problems apply not just to component-mounted-board production lines but to various production lines that use wireless power supply.

Solution to Problem

To solve the above problems, the present disclosure is a safety system for a production line in which a work device is configured to move along multiple production devices arranged in a row, wherein each of the multiple production devices is provided with a power supplying section configured to supply electric power wirelessly, and the work device is provided with a power receiving section configured to receive electric power supplied wirelessly from the power supplying section of the production device opposite the power receiving section among the multiple production devices, a monitoring section configured to monitor whether a person or object has entered a monitoring area around the work device, a driving section configured to move the work device, a power source circuit section configured to operate the monitoring section, the control section, and the driving section using the electric power received from the power receiving section as a power source, and a safety circuit section configured to block supply of power to the driving section and to maintain power supply to the monitoring section and the control section when the monitoring section detects that a person or object has entered the monitoring area.

With this configuration, when the work device moves along the row of multiple production devices that configures the production line, the monitoring section determines whether a person or an object has entered a monitoring area around the work device, and if the monitoring section detects that a person or object has entered the monitoring area, power supply to a driving section of the work device is cut, to perform an emergency stop of the work device. Accordingly, it is possible to prevent the work device colliding with a person or object that has entered the monitoring area around the work device, thus improving safety. Further, during the period of the emergency stop of the work device, because the safety circuit section of the work device maintains power supply to the control section and the monitoring section, it is possible to monitor whether a person or object has entered the monitoring area even while the work device is stopped due to the emergency stop, and the control section of the work device can continue processing, and when the person or object that entered the monitoring area exits the monitoring area, it is possible to restart moving the work device quickly.

In this case, restarting of moving of the work device may be performed via manual operation by an operator, and the safety circuit section of the work device may restart power supply to the driving section when the monitoring section has detected that the person or object that entered the monitoring area has exited the monitoring area. Accordingly, when the monitoring section has detected that the person or object has exited the monitoring area, moving of the work device is restarted automatically, and the emergency stop time is minimized.

Further, with the present disclosure, the production line may be provided with an emergency stop button configured to be operated by a person, and an emergency stop circuit section configured to turn off the wireless power supply of the power supplying section of the production device when the emergency stop button is pushed. Accordingly, when someone pushes the emergency stop button the wireless power supply of the power supplying section of the production device is turned off immediately, thus turning off the power supply to the work device, meaning that the emergency stop is performed immediately for the work device. In this case, because a connection using a wire can be made between the emergency stop button and each production device power supplying section, the problems related to permissions required in various countries and the delay in the emergency stop due to the wireless communication do not occur.

The present disclosure may be applied to any production line in which a work device moves along a row of multiple production devices, for example, a component-mounted-board production line including a component mounter among the multiple production devices, wherein the work device is an automatic exchanging device configured to automatically exchange a component-supply-use feeder configured to be set on a feeder setting section of the component mounter. Accordingly, safety can be improved at a component-mounted-board production line equipped with an automatic exchanging device.

DESCRIPTION OF EMBODIMENTS

An embodiment of the present disclosure is described below in the form of a component-mounted-board production line.

First, the configuration of component-mounted-board production line 10 is described based on FIGS. 1 to 5. Component-mounted-board production line 10 (production line) is configured from multiple component mounters 12 (production devices) lined up in a row along a conveyance direction (X direction) of circuit board 11, with a solder printer (not shown) for printing solder on circuit board 11, feeder storage device 19 (production device) for storing cassette-type feeders 14, and the like being provided on the board loading side of the component-mounted-board production line 10.

Figure 3:
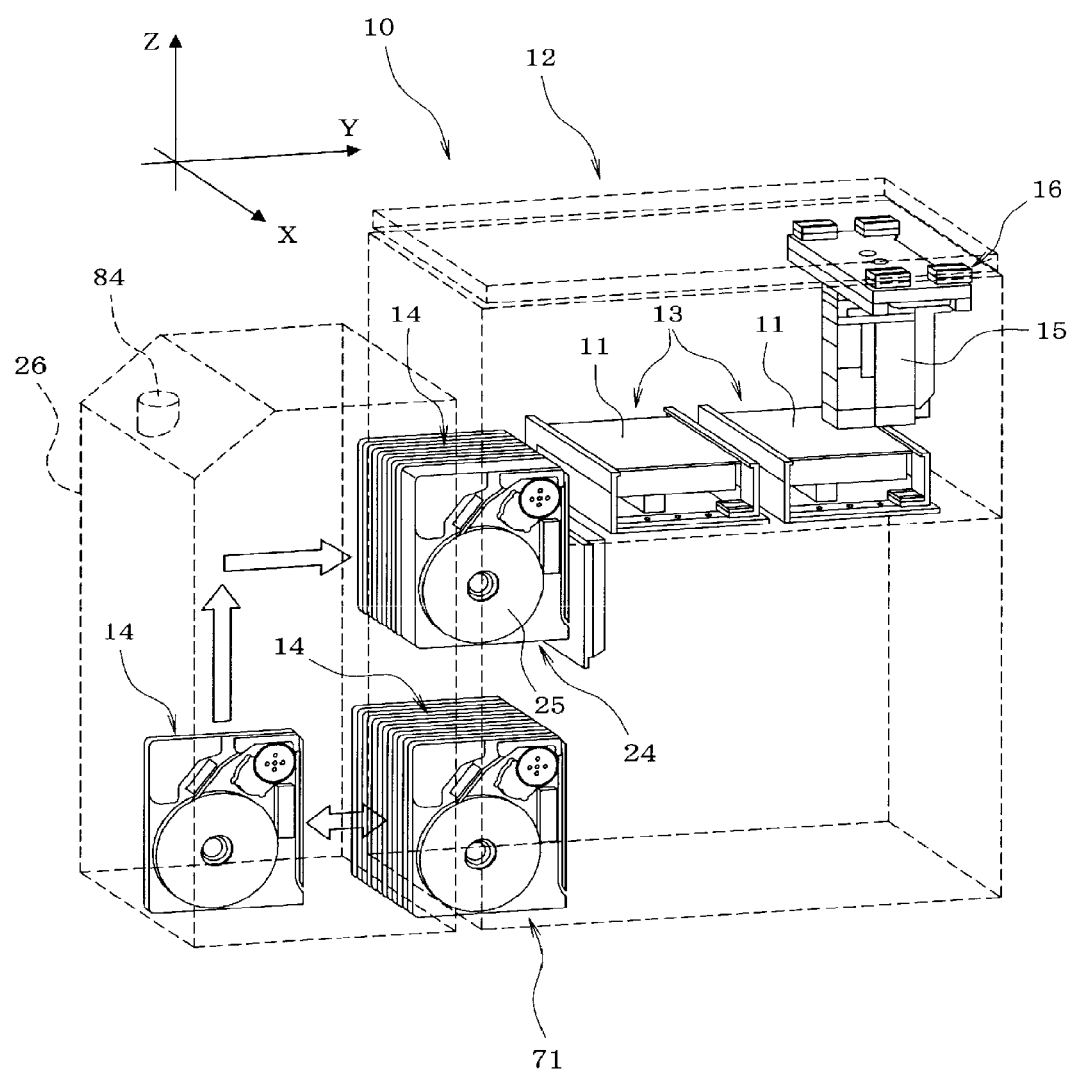
FIG. 3 is a perspective view schematically showing the configuration of the automatic exchanging device and a component mounter.

As shown in FIG. 3, each component mounter 12 is provided with two conveyors 13 that convey circuit board 11, mounting head 15 that holds a suction nozzle (not shown) for picking up a component supplied by cassette-type feeder 14 and mounting the component on circuit board 11, head moving device 16 that moves mounting head 15 in the XY directions (left-right and front-rear directions), component imaging camera 17 (refer to FIG. 5) that images from below the component being held by the suction nozzle, and the like. Mark imaging camera 18 (refer to FIG. 5) for imaging reference marks (not shown) of circuit board 11 is attached to head moving device 16 so as to move in the XY directions together with mounting head 15.

Figure 5:
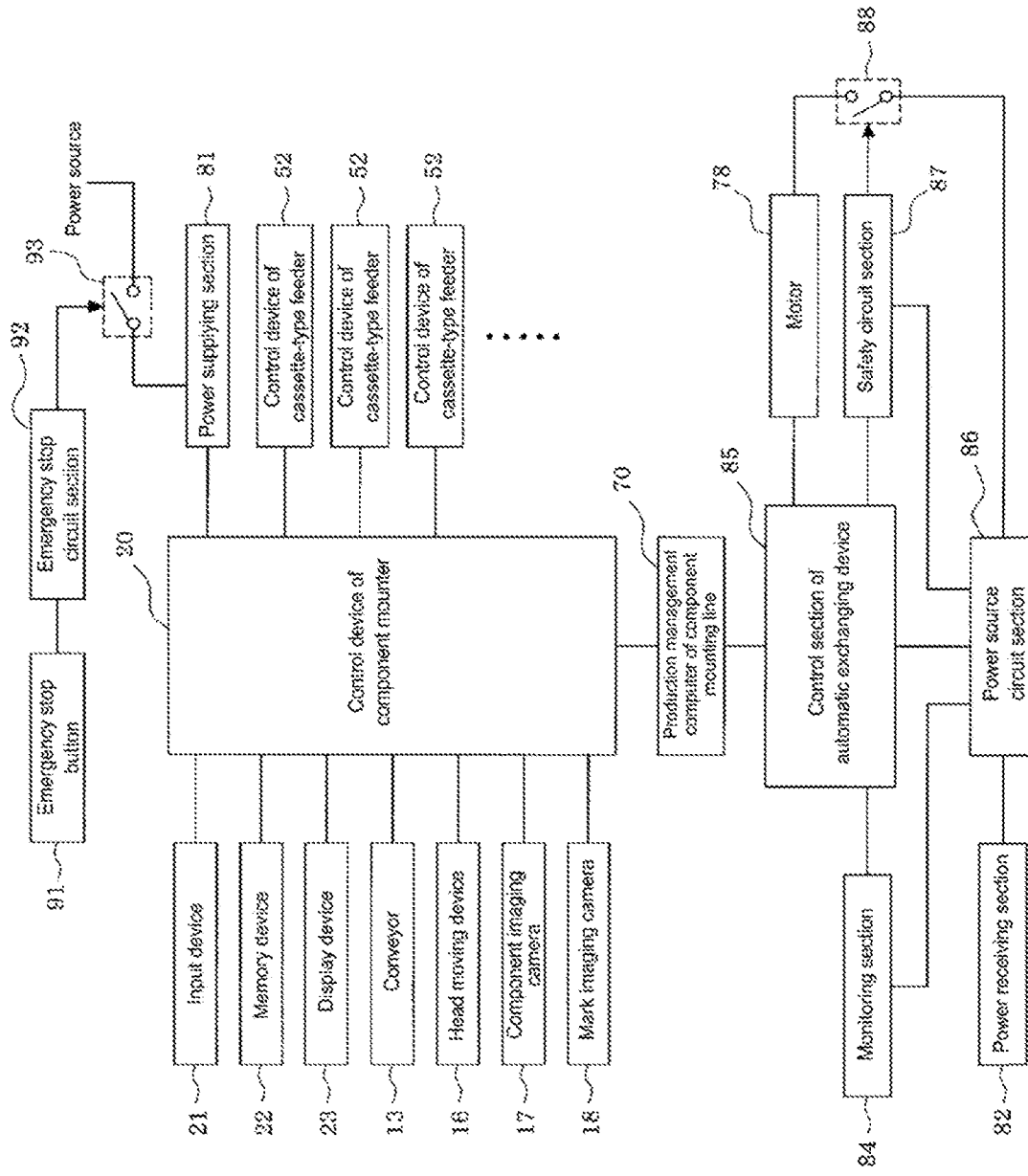
FIG. 5 is a block diagram schematically showing the configuration of control items of the component-mounted-board production line equipped with the automatic exchanging device.

As shown in FIG. 5, connected to control device 20 of component mounter 12 are, for example, input device 21 such as a keyboard, mouse, or touchscreen panel; memory device 22 (memory means) including a hard disk, RAM, ROM and so on for memorizing various types of programs, data, and the like used for control; and display device 23 such as a liquid crystal display or CRT. Control device 20 of each component mounter 12 is connected via a network to production management computer 70 that manages overall production of component-mounted-board production line 10, and production of component-mounted-board production line 10 is managed by production management computer 70.

In each of the component mounters 12 of component-mounted-board production line 10, circuit board 11 conveyed from an upstream component mounter 12 is conveyed to a specified position by conveyor 13, the circuit board 11 is clamped in position by a clamp mechanism (not illustrated), a reference mark of the circuit board 11 is imaged by mark imaging camera 18 to recognize the position (reference position of the circuit board 11) of the reference mark; and a component supplied from cassette-type feeder 14 is picked by the suction nozzle of mounting head 15, moved from the pickup position to an imaging position, and imaged from below by component imaging camera 17 to determine a pickup position deviation amount and the like; thereafter, the pickup position deviation amount is corrected and the component is mounted on the circuit board 11 on conveyor 13 to produce a component-mounted-board.

Figure 4:
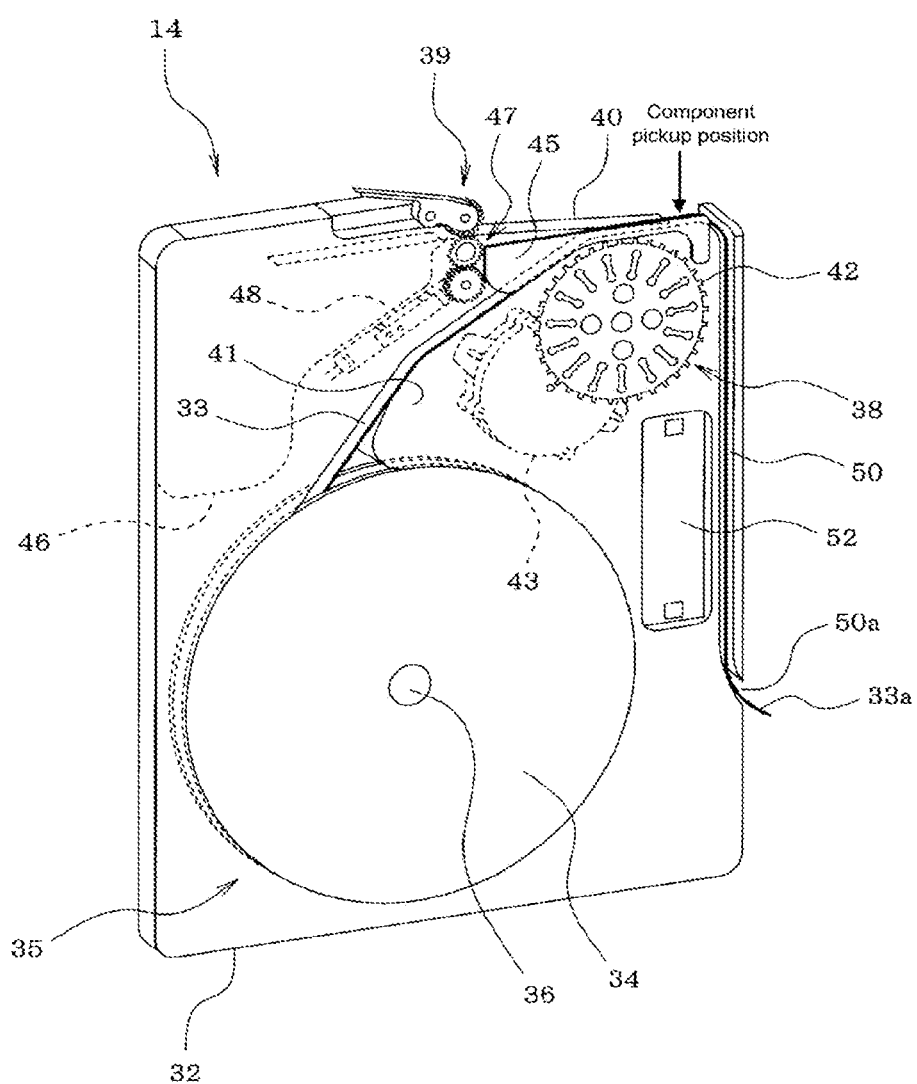
FIG. 4 is a perspective view showing a cassette-type feeder.

Next, the configuration of cassette-type feeder 14 is described with reference to FIG. 4. Cassette-case 32 of cassette-type feeder 14 is formed from transparent or non-transparent plastic or metal plates or the like, and a side section (cover) thereof can be opened and closed. Tape loading section 35, in which tape reel 34 around which component supply tape 33 is wound is loaded in a detachable (exchangeable) manner, is provided inside the cassette case 32. Reel holding shaft 36 that holds tape reel 34 in a rotatable manner is provided in the center of tape loading section 35.

Tape feeding mechanism 38 that feeds component supply tape 33 pulled out from tape reel 34 to a component pickup position, and top film peeling mechanism 39 that peels top film 40 (also known as cover tape) from component supply tape 33 before the component pickup position to expose components in component supply tape 33 are provided inside cassette case 32.

Tape feeding mechanism 38 is formed from sprocket 42 that is provided in the vicinity below the component pickup position, motor 43 that drives sprocket 42 to rotate, and the like, and tape feeding mechanism 38 pitch feeds component supply tape 33 to the component pickup position by engaging the teeth of sprocket 42 with tape feeding holes, which are formed in the edge of one side of component supply tape 33 at a predetermined pitch, and rotating sprocket 42.

Top film peeling mechanism 39 is formed from tape retainer 45 for retaining component supply tape 33 before the component pickup position and peeling top film 40 from the top surface of component supply tape 73, top film feeding gear mechanism 47 that pulls top film 40 that is peeled by tape retainer 45 in the opposite direction from the tape feeding direction to feed top film 40 into top film collection section 46, which is provided on the top portion of cassette case 32, motor 48 that drives top film feeding gear mechanism 47, and the like.

Waste tape disposal path 50 that guides waste tape 33a (in the first embodiment, only the carrier tape from which top film 40 has been peeled), which has passed the component pickup position and from which the components have been removed, downward to dispose of waste tape 33a is provided extending downwards at the end section of the tape feeding direction side within cassette case 32, and outlet 50a of waste tape disposal path 50 is provided in a position closer to the bottom side than the center of the end surface of the tape feeding direction side of cassette case 32.

Control device 52 that controls motor 43 of tape feeding mechanism 38 and motor 48 of top film peeling mechanism 39 is provided within cassette case 32. In addition, while not shown in the drawings, a connector for communication and power that is connected to the connector for communication and power of component mounter 12 is provided in cassette case 32.

Figure 1:
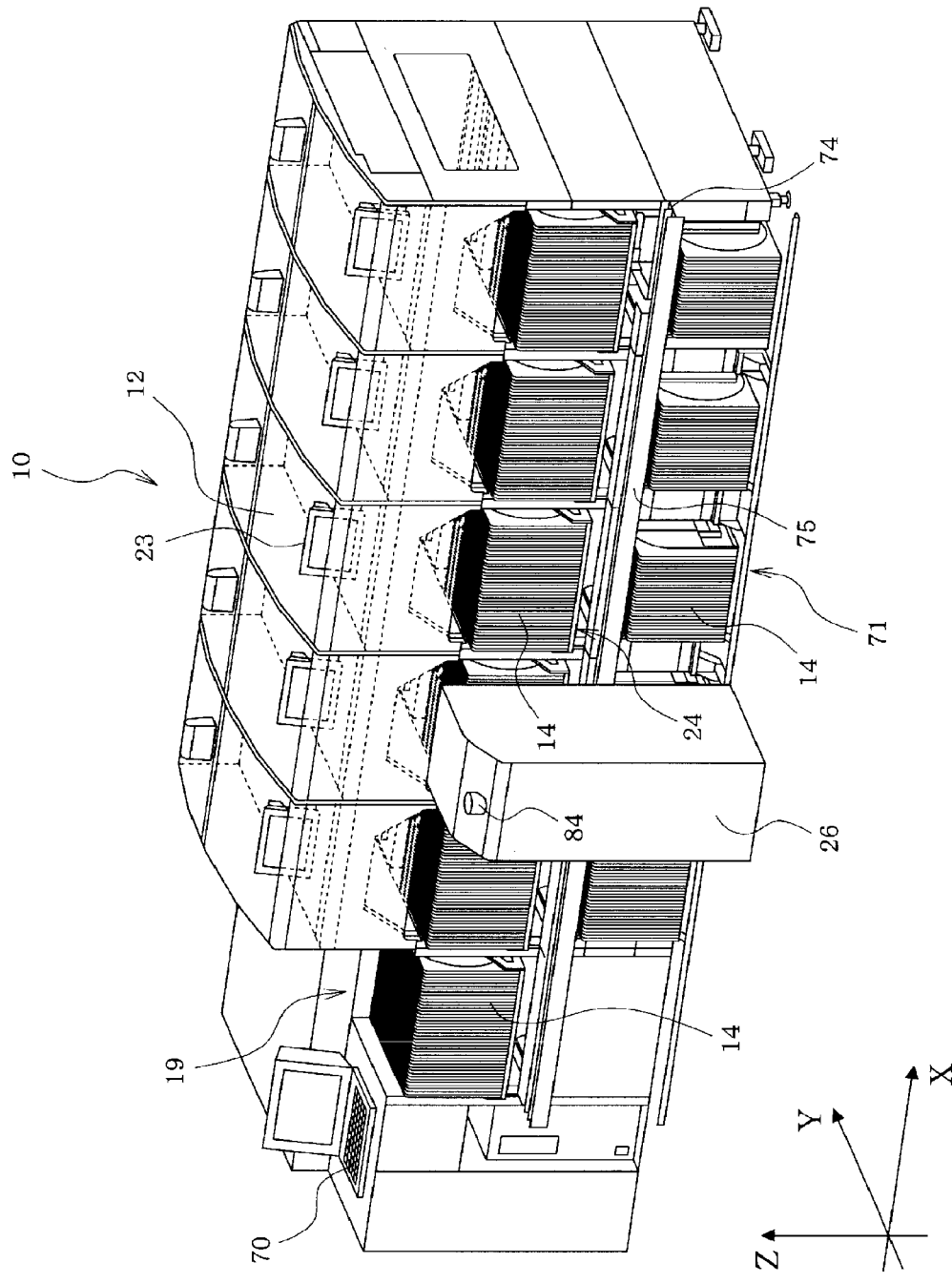
FIG. 1 is a perspective view showing the overall configuration of a component-mounted-board production line that is an embodiment of the present disclosure.

As shown in FIG. 1, automatic exchanging device 26 (work device) that performs setting and removing of cassette-type feeders 14 to and from feeder setting section 24 of each component 12 is provided on the front side of component-mounted-board production line 10. Stock section 71 for stocking multiple feeders 14 to be set on feeder setting section 24 is provided below feeder setting section 24 of each component mounter 12. Automatic exchanging device 26 removes feeders 14 that are exchange targets from feeder setting section 24 of the multiple component mounters 12 and collects them in stock section 71, and removes feeders 14 specified in the production job (production program) from stock section 71 and sets the feeders 14 in the feeder setting section 24 of the multiple component mounters 12.

Guide rail 74 for moving automatic exchanging device 26 in the left-right direction (X direction) along the row of component mounters 12 is provided on the front side of component-mounted-board production line 10 so as to extend in the X direction along the entire length of component-mounted-board production line 10. The board loading side of guide rail 74 extends to feeder storage device 19, and automatic exchanging device 26 moves in front of feeder storage device 19, removes feeders 14 specified in the production job from feeder storage device 19, and returns used feeders 14 to feeder storage device 19.

Figure 6:
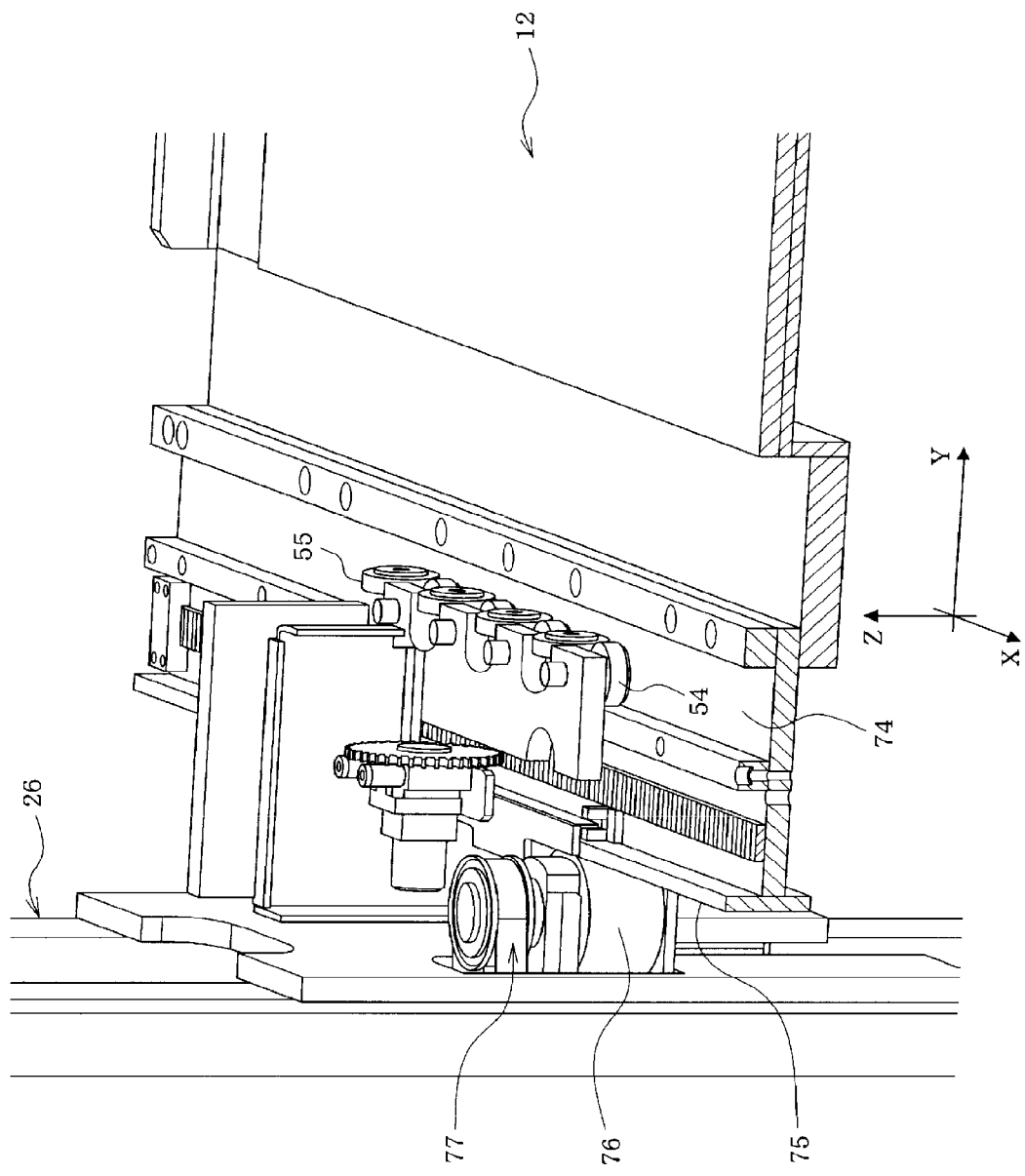
FIG. 6 is a perspective view showing the configuration of the driving device that drives the automatic exchanging device and surrounding portions.

As shown in FIG. 6, provided on the rear side of automatic exchanging device 26 in a freely rotating manner and alternating one after another are multiple Y-direction regulating guide rollers 54 that regulate the movement of automatic exchanging device 26 in the Y direction (a direction perpendicular to the X direction), and multiple Z-direction regulating guide rollers 55 that regulate the movement of automatic exchanging device 26 in the Z direction (up-down direction); Y-direction regulating rollers 54 roll along the side wall of guide rail 74 and Z-direction regulating rollers 55 roll along the horizontal surface of guide rail 74, thereby guiding automatic exchanging device 26 to be moved in the X direction only.

Figure 7:
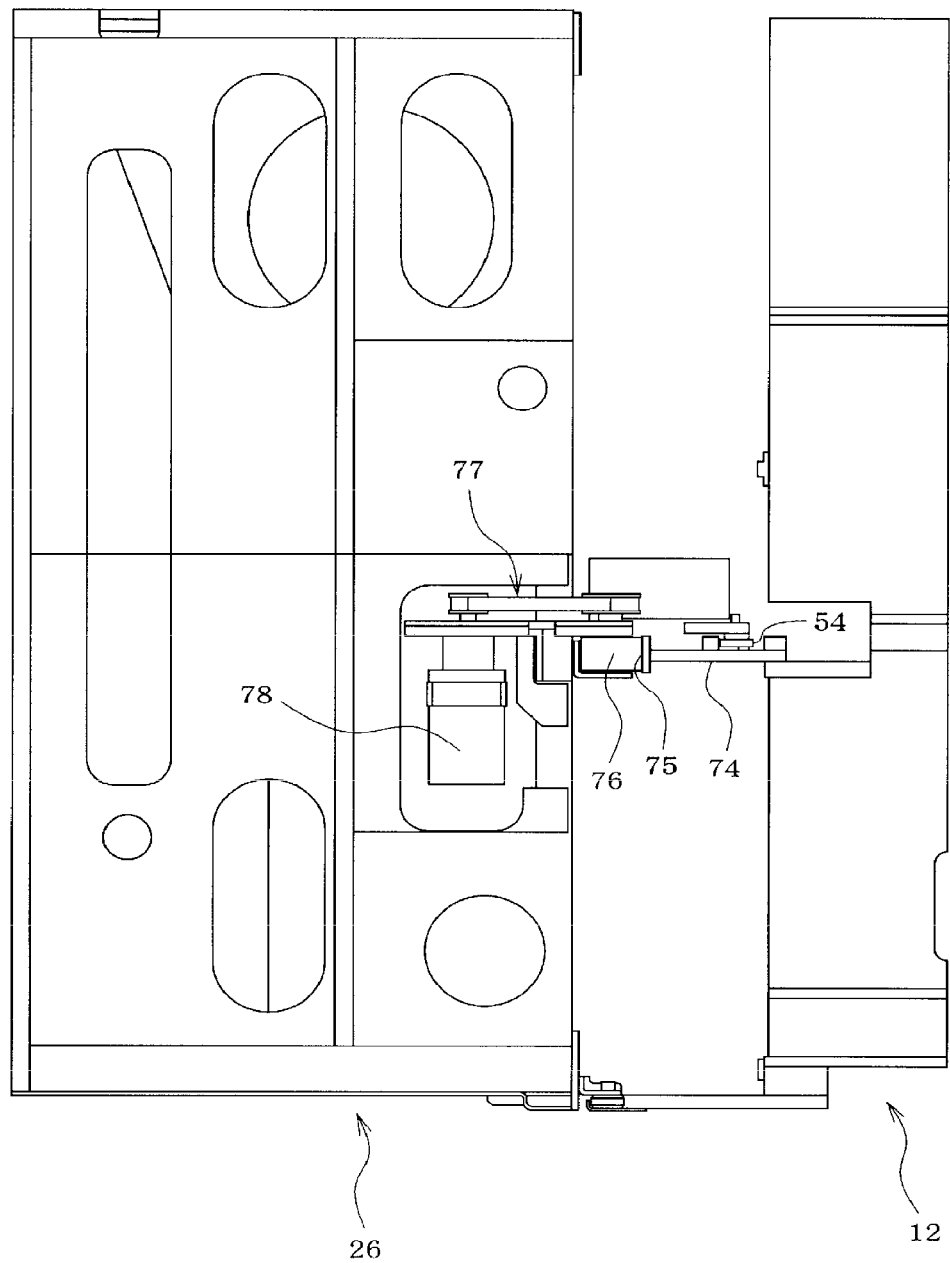
FIG. 7 is a side view showing the configuration of the driving device that drives the automatic exchanging device and surrounding portions.

A space on the front side of component-mounted-board production line 10 is a moving lane along which automatic exchanging device 26 moves in the X direction, and moving rail 75 is provided on guide rail 74 on the front side of component-mounted-board production line 10 extending in the X direction. With respect to this, as shown in FIGS. 6 and 7, motor 78 (driving section) for drive-rotating driving wheel 76, which is formed of an elastic material such as rubber, via belt transmission mechanism 77 is provided on automatic exchanging device 26, and by driving wheel 76 rolling along moving rail 75, automatic exchanging device 26 is driven in the X direction.

Figure 2:
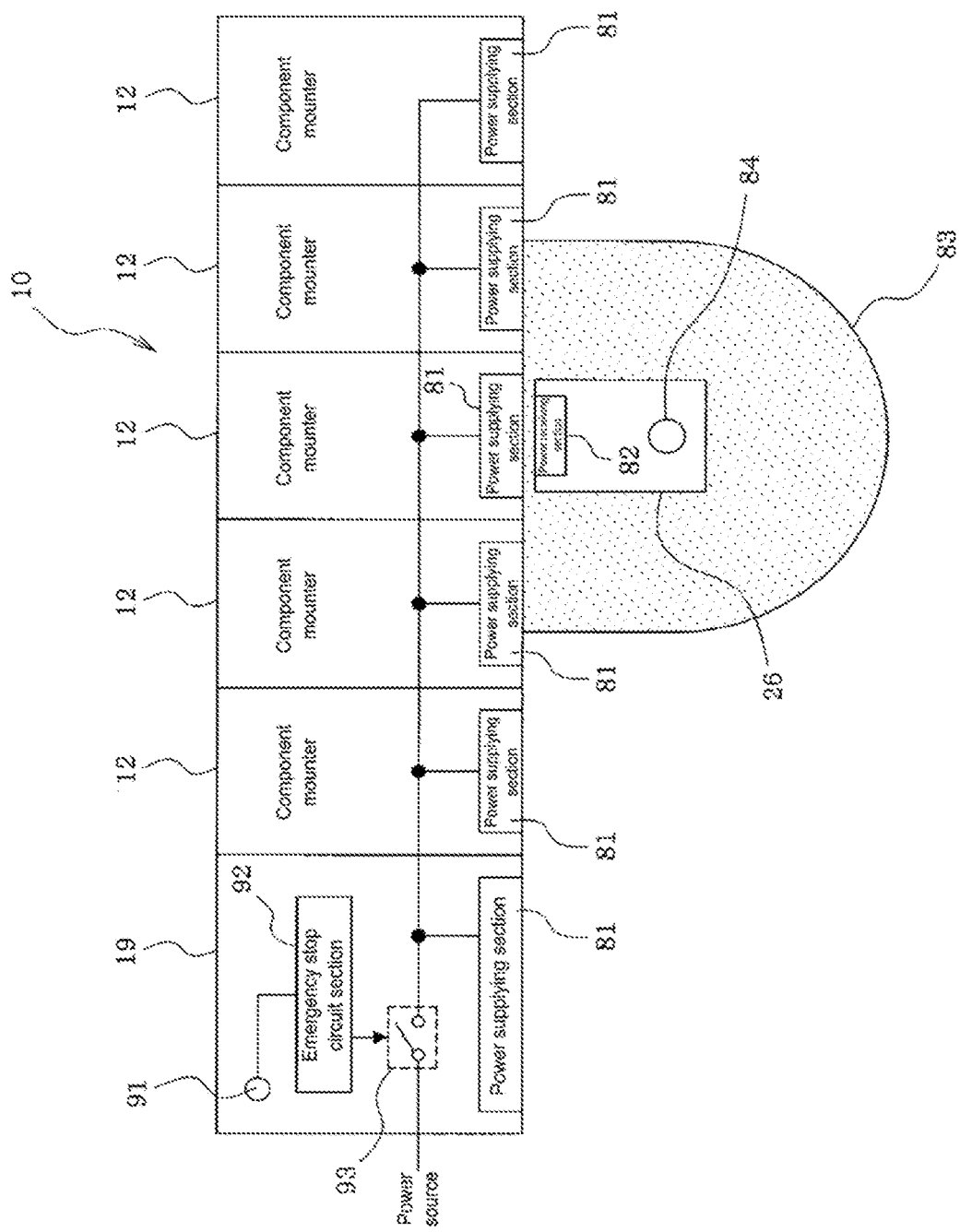
FIG. 2 is a plan view of the component-mounted-board production line illustrating wireless power supply of and a monitoring area around an automatic exchanging device.

As shown in FIG. 2, power supplying section 81 that supplies power wirelessly is provided on the front side of each component mounter 12 and feeder storage device 19, and power receiving section 82 that receives electric power wirelessly from the power supplying section 81 of component mounter 12 or the power supplying section 81 of feeder storage device 19 that automatic exchanging device 26 is opposite is provided on automatic exchanging device 26. Power receiving section 82 and power supplying section 81 used for wireless power supply are configured to also function as visible light communication units to allow communication of various control signals, data signals, and the like between component mounters 12 and automatic exchanging device 26.

Further, monitoring section 84 that monitors whether a person or object has entered monitoring area 83 around automatic exchanging device 26 is provided on automatic exchanging device 26. Monitoring section 84 is, for example, configured using a safety laser scanner. Monitoring area 83 is an area for which automatic exchanging device 26 performs an emergency stop if a person or object enters the area, to prevent collisions with automatic exchanging device 26. Note that, the width of monitoring area 83 can be changed freely by the user.

As shown in FIG. 5, automatic exchanging device 26 is provided with: power source circuit section 86 for operating monitoring section 84, control section 85, and motor 78 using electric power received by power receiving section 82 as a power source; and safety circuit section 87 that turns off relay switch 88 and cuts power supply to motor 78 when monitoring section 84 detects that a person or object has entered monitoring area 83. According to this configuration, when monitoring section 84 detects that a person or object has entered monitoring area 83, safety circuit section 87 turns off relay switch 88 of automatic exchanging device 26 and cuts the power supply to motor 78 so as to make automatic exchanging device 26 stop, but while automatic exchanging device 26 is in this emergency stop state, power supply to monitoring section 84 and control section 85 is maintained, therefore, even during the emergency stop of automatic exchanging device 26, monitoring section 84 monitors whether a person or object enters monitoring area 83, and control section 85 continues processing, such that, when it is detected that the person or object that entered monitoring area 83 has exited monitoring area 83, safety circuit section 87 of automatic exchanging device 26 turns on relay switch 88 and restarts power supply to motor 78, such that movement of automatic exchanging device 26 is restarted.

Further, as shown in FIG. 2, provided on component-mounted-board production line 10 are emergency stop button 91 configured to be operated by a person, and emergency stop circuit section 92 configured to turn off relay switch 93 to turn off the wireless power supply of power supplying section 81 when emergency stop button 91 is pushed. According to this configuration, when an operator pushes emergency stop button 91, emergency stop circuit section 92 turns off relay switch 93 to turn off the wireless power supply of power supplying section 81, thereby cutting the power to automatic exchanging device 26 to put automatic exchanging device 26 in an emergency stop state.

According to the embodiment above, when automatic exchanging device 26 moves along the row of multiple component mounters 12 that configures component-mounted-board production line 10, monitoring section 84 determines whether a person or an object has entered monitoring area 83 around the automatic exchanging device 26, and if monitoring section 84 detects that a person or object has entered monitoring area 83, power supply to motor 78 of is cut by safety circuit section 87 of the automatic exchanging device 26 to perform an emergency stop of the work device, therefore, the automatic exchanging device 26 is prevented from colliding with a person or object that has entered monitoring area 83 around the automatic exchanging device 26, thus safety is improved. Further, during the period of the emergency stop of automatic exchanging device 26, because safety circuit section 87 of the automatic exchanging device 26 maintains power supply to control section 85 and monitoring section 83, it is possible to monitor whether a person or object has entered monitoring area 83 even while the automatic exchanging device 26 is stopped due to the emergency stop, and control section 85 of the automatic exchanging device 26 can continue processing. Accordingly, when it is detected that the person or object that entered monitoring area 83 has exited monitoring area 83, moving of the automatic exchanging device 26 is restarted automatically, and the emergency stop time is minimized.

However, restarting of moving of the automatic exchanging device 26 may be performed by a manual operation of an operator.

Further, in the embodiment above, component-mounted-board production line 10 is provided with emergency stop button 91 configured to be operated by a person, and emergency stop circuit section 92 configured to turn off the wireless power supply of power supplying section 81 of component mounter 12 when emergency stop button 91 is pushed, therefore, when a person pushes emergency stop button 91, the power supply to the automatic exchanging device 26 is cut immediately to put the automatic exchanging device 26 into an emergency stop state. In this case, because a connection using a wire can be made between emergency stop button 91 and power supplying section 81 of each component mounter 12, the problems related to permissions required in various countries and the delay in the emergency stop due to the wireless communication do not occur.

Note that, the present disclosure is not limited to the above embodiment, for example, the disclosure may be configured such that an emergency stop button is also provided on automatic exchanging device 26 and an emergency stop of automatic exchanging device 26 may be performed when this emergency stop button is pushed, and multiple automatic exchanging devices 26 may be arranged at a single component-mounted-board production line.

Further, other appropriate changes may be made, for example, to the configuration of safety circuit section 87 of automatic exchanging device 26, the configuration of emergency stop circuit 92 of component-mounted-board production line 10, the configuration of component mounters 12, the configuration of automatic exchanging device 26, and the configuration of feeders 14.

Also, it goes without saying that the present disclosure is not only applicable to a production line for component-mounted-boards, and may be applied to various production lines so long as there is a work device that moves along a row of multiple production devices; further, various other changes may be made that do not depart from the gist of this disclosure.

REFERENCE SIGNS LIST

10: component-mounted-board production line (production line);
11: circuit board;
12: component mounter (production device);
13: conveyor;
14: cassette-type feeder;
15: mounting head;
16: head moving device;
20 control device of component mounter;
26: automatic exchanging device (work device);
54: Y-direction regulating guide roller;
55: Z-direction regulating guide roller;
70: production management computer;
71: stock section;
74: guide rail;
75: moving rail;
76: driving wheel;
77: belt transmission mechanism;
78: motor (driving device);
81: power supplying section;
82: power receiving section;
83: monitoring area;
84: monitoring section;
85: control section of automatic exchanging device;
86: power source circuit section;
87: safety circuit section;
88: relay switch;
91: emergency stop button;
92: emergency stop circuit section;
93: relay switch

The invention claimed is:

1. A safety system for a production line comprising:
a work device configured to move along multiple production devices arranged in a row,
wherein
each of the multiple production devices is provided with
a power supplying section configured to supply electric power wirelessly, and
the work device includes
a power receiving section configured to receive electric power supplied wirelessly from the power supplying section of the production device opposite the power receiving section among the multiple production devices,
a monitoring section configured to continuously monitor whether a person or object has entered a monitoring area around the work device, the monitoring section operating independently of the person or object, a motor configured to move the work device, a controller configured to operate the work device, and circuitry configured to
operate the monitoring section, the controller, and the motor using the electric power received from the power receiving section as a power source, and
block supply of power to the motor while maintaining power supply to the monitoring section and the controller when the monitoring section detects that a person or object has entered the monitoring area.

2. The safety system for a production line according to claim 1, wherein
the circuitry is configured to restart supplying power to the motor when the monitoring section detects that the person or object that entered the monitoring area has exited the monitoring area.

3. A production line comprising:
the safety system according to claim 1, wherein
the production line includes
an emergency stop button, and
circuitry configured to turn off the wireless power supply of the power supplying section of the production device when the emergency stop button is pushed.

4. The safety system for a production line according to claim 1, wherein
the production line is a component-mounted-board production line including a component mounter among the multiple production devices, and
the work device is an automatic exchanging device configured to automatically exchange a component-supply-use feeder configured to be set on a feeder setting section of the component mounter.

5. The safety system for a production line according to claim 1, wherein
the monitoring section is a safety laser scanner.

* * * * *